US012640344B2

(12) United States Patent
Turner

(10) Patent No.: US 12,640,344 B2
(45) Date of Patent: May 26, 2026

(54) SYSTEM AND METHOD FOR ENHANCED RF POWER DELIVERY USING HARMONIC WAVEFORM SYNTHESIS

(71) Applicant: HORIBA STEC CO., LTD., Kyoto (JP)

(72) Inventor: Terry R. Turner, Austin, TX (US)

(73) Assignee: HORIBA STEC CO., LTD. (JP)

( * ) Notice: Subject to any disclaimer, the term of this patent is extended or adjusted under 35 U.S.C. 154(b) by 48 days.

(21) Appl. No.: 18/976,123

(22) Filed: Dec. 10, 2024

(65) Prior Publication Data

US 2025/0191879 A1     Jun. 12, 2025

Related U.S. Application Data

(60) Provisional application No. 63/608,625, filed on Dec. 11, 2023.

(51) Int. Cl.
H01J 37/32          (2006.01)

(52) U.S. Cl.
CPC .. H01J 37/32128 (2013.01); H01J 37/32183 (2013.01); H01J 37/3299 (2013.01); *H01J 2237/24564* (2013.01)

(58) Field of Classification Search
CPC ........... H01J 37/32082; H01J 37/32146; H01J 37/32155; H01J 37/32128; H01J 37/3299; H01J 37/32174; H01J 37/32183; H01J 37/32211; H01J 37/32935; H01J 2237/24564
See application file for complete search history.

(56) References Cited

U.S. PATENT DOCUMENTS

| | | | |
|---|---|---|---|
| 2014/0265833 A1* | 9/2014 | Albarede ................. | H05H 1/46 |
| | | | 315/39 |
| 2016/0165713 A1* | 6/2016 | Yuzurihara ....... | H01J 37/32926 |
| | | | 315/111.21 |
| 2019/0333738 A1* | 10/2019 | Coumou ............... | H01J 37/321 |

(Continued)

FOREIGN PATENT DOCUMENTS

EP          0840350 A2     5/1998

OTHER PUBLICATIONS

International Search Report dated Jan. 30, 2025 issued for International Application No. PCT/US2024/059412.

*Primary Examiner* — Thai Pham
(74) *Attorney, Agent, or Firm* — Brooks Kushman P.C.

(57)          ABSTRACT

The present disclosure provides a RF power delivery method for delivering the RF power to a plasma load in a microelectronic manufacturing environment. The RF power delivery method includes generating a harmonically distorted sinusoidal waveform. Such harmonically distorted sinusoidal waveform being derived from a predetermined harmonic signature corresponding to a desired plasma state. Next, the method includes amplifying the harmonically distorted sinusoidal waveform and capable of operating under conditions of high reflected power. Next, the method includes interfacing with a non-linear plasma load impedance. Thereafter, the method includes measuring the RF power spectrum at an output of the fixed impedance matching network, the measured spectrum being used to adjust the amplified harmonically distorted sinusoidal waveform to recreate a desired plasma state.

20 Claims, 6 Drawing Sheets

(56)            References Cited

U.S. PATENT DOCUMENTS

| | | | |
|---|---|---|---|
| 2022/0037123 A1* | 2/2022 | Zhang ..................... | H03F 3/211 |
| 2023/0317414 A1* | 10/2023 | Marakhtanov .... | H01J 37/32165 |
| | | | 315/111.21 |
| 2024/0112886 A1* | 4/2024 | Shi .................... | H01J 37/32183 |
| 2024/0404788 A1* | 12/2024 | Luu ................... | H01J 37/32146 |

* cited by examiner

600

SYSTEM AND METHOD FOR ENHANCED RF POWER DELIVERY USING HARMONIC WAVEFORM SYNTHESIS

BACKGROUND OF THE INVENTION

The present application claims the benefit of U.S. Provisional Application No. 63/608,625, filed Dec. 11, 2023; all of which is incorporated herein and referenced thereto.

FIELD OF THE INVENTION

The present invention relates to power delivery systems, and in particular, relates to a system and method for enhanced Radio Frequency (RF) power delivery using harmonic waveform synthesis in a microelectronic manufacturing environment.

DESCRIPTION OF THE PRIOR ART

Microelectronic manufacturing relies heavily on plasma-based processes to achieve precise etching and deposition of materials on workpieces. Plasma, a state of matter characterized by ionized gases, is commonly generated by disassociating feed gases using Radio Frequency (RF) power. A typical RF power delivery system for such plasma generation consists of a signal generator, an amplifier, and an impedance-matching network. The signal generator creates a single-frequency sinusoidal waveform that is amplified to the power levels required for plasma formation. The impedance-matching network ensures efficient power transfer by transforming the RF generator's output impedance (commonly 50 ohms) to match the inherently non-linear impedance of the plasma load. However, the plasma load's dynamic and non-linear characteristics introduce harmonic distortion into the RF signal, complicating the delivery of consistent and reproducible RF power.

The conventional RF power delivery systems face several limitations, such as harmonic distortion generated by the plasma load affects the stability of voltage and current sine waves, leading to process variability. Such a level of distortion is influenced by factors such as ion and electron densities, collision frequencies, and neutral constituents in the plasma. It may be apparent to a person skilled in the art that these variables make it challenging to recreate identical plasma conditions across tools, resulting in inconsistent manufacturing outcomes. Moreover, the impedance-matching networks in traditional systems rely on mechanical or electronic tuning to minimize reflected power. Since, such networks are prone to wear and degradation due to thermal cycling, mechanical stress, and arcing, they introduce variability in the delivered RF power, further exacerbating process inconsistencies. In modern manufacturing facilities, the demand for shorter process times has led to the increased use of fixed impedance matching networks that eliminate tuning delays. However, these fixed networks are less effective at handling the dynamic impedance of plasma loads, causing power delivery inefficiencies and variability.

However, such challenges have been partially addressed by the existing solutions through the development of auto-tuning impedance-matching networks and advanced power amplifiers with greater tolerance for reflected power. While these approaches improve power delivery to some extent, they fall short in consistently mitigating the harmonic distortion caused by the plasma load. For example, auto-tuning networks cannot respond quickly enough to real-time impedance changes in pulsed RF power delivery scenarios, leading to inefficiencies. Similarly, while broadband amplifiers can handle reflected power, they do not address the root cause of variability i.e., harmonic distortion in the RF waveform.

Thus, there is a need for an advanced system and method for enhanced RF power delivery using harmonic waveform synthesis that addresses the variability caused by plasma-induced harmonic distortion, eliminates the dependency on auto-tuning impedance matching networks, and ensures precise recreation of desired plasma states for consistent manufacturing outcomes.

The information disclosed in this background of the disclosure section is only for enhancement of understanding of the general background of the disclosure and should not be taken as an acknowledgment or any form of suggestion that this information forms existing information already known to a person skilled in the art.

SUMMARY OF THE INVENTION

The present disclosure relates to a Radio Frequency (RF) power delivery system and method (hereafter together termed as 'mechanism') for delivering the RF power using harmonic waveform synthesis to address the limitations of conventional RF power delivery systems in microelectronic manufacturing environments. By generating harmonically distorted sinusoidal waveforms derived from pre-determined harmonic signatures corresponding to desired plasma states, the disclosure enables precise recreation of plasma conditions, significantly reducing process variability and improving reproducibility.

In an embodiment of the present disclosure, the mechanism includes a mathematical waveform generator that produces harmonically distorted sinusoidal waveforms based on a harmonic signature determined from optimal plasma conditions. These waveforms are amplified using a broadband linear power amplifier designed to handle high reflected power, ensuring robustness and stability in dynamic plasma environments. The amplified waveforms are coupled to the plasma load via a fixed impedance matching network, which minimizes variability in delivered RF power by eliminating the need for real-time tuning.

Further, the mechanism incorporates a broadband power spectrum sensor to measure the RF power spectrum at the output of the impedance-matching network. Such a sensor provides real-time feedback to adjust the amplified waveform, ensuring alignment with the desired harmonic signature and thereby maintaining the intended plasma state. Additionally, the mechanism includes a broadband voltage and current sensor to enable advanced process control applications, such as endpoint detection and chamber health monitoring. In an embodiment, the mechanism is also adaptable to modern manufacturing requirements, integrating seamlessly with a manufacturing enterprise system (MES) to receive and utilize harmonic signature data tailored to specific process recipes. Additionally, it supports pulsed RF power delivery and component optimization, offering versatility across a range of plasma-based manufacturing applications.

An embodiment of the present disclosure discloses the RF power delivery system for delivering the RF power to the plasma load in the microelectronic manufacturing environment. In an embodiment, the radio frequency (RF) power delivery system includes a mathematical waveform generator that generates harmonically distorted sinusoidal waveforms. Such harmonically distorted sinusoidal waveforms are derived from predetermined harmonic signatures that correspond to desired plasma states. In an embodiment, the mathematical waveform generator generates the harmonically distorted sinusoidal waveform using a mathematical representation of the harmonic signature expressed as a summation of sinusoidal components of varying amplitudes and frequencies.

In an embodiment, the radio frequency (RF) power delivery system includes a broadband linear power amplifier, which amplifies the harmonically distorted sinusoidal waveforms and is capable of operating under conditions of high reflected power. To ensure efficient power transfer, the system utilizes a fixed impedance matching network that interfaces with the non-linear impedance characteristics of the plasma load. Further, the broadband linear power amplifier includes a feedback control mechanism to adjust gain based on the amplitude of the fundamental frequency component of the harmonically distorted sinusoidal waveform.

In an embodiment, the radio frequency (RF) power delivery system includes a fixed impedance matching network to interface with a non-linear plasma load impedance. Additionally, the RF power delivery system includes a broadband voltage and current sensor positioned downstream of the fixed impedance matching network, wherein the broadband voltage and current sensor monitors parameters of plasma load for process control applications. The broadband voltage and current sensor is used for endpoint detection during plasma processing. In an embodiment, the fixed impedance matching network minimizes variability in delivered RF power by eliminating need for real-time tuning. Additionally, the fixed impedance matching network is optimized for specific plasma process conditions, including pulsed RF power delivery.

In an embodiment, the radio frequency (RF) power delivery system includes a broadband power spectrum sensor to measure the RF power spectrum at an output of the fixed impedance matching network, the measured spectrum being used to adjust the amplified harmonically distorted sinusoidal waveform to recreate a desired plasma state. Such broadband power spectrum sensor also provides real-time feedback for adjusting the harmonic content of the waveform to match a reference plasma state. Further, the harmonic signature is derived from measurements taken from a plasma process tool operating in a known optimal state. In an embodiment of the present disclosure, the RF power delivery system also includes a manufacturing enterprise system (MES) configured to communicate process-specific harmonic signature data to the mathematical waveform generator.

An embodiment of the present disclosure discloses the RF power delivery method for delivering the RF power to the plasma load in the microelectronic manufacturing environment. The RF power delivery method includes the steps of generating a harmonically distorted sinusoidal waveform that is derived from a predetermined harmonic signature corresponding to a desired plasma state. In some embodiments, the generation of the harmonically distorted sinusoidal waveform further includes using a mathematical representation of the harmonic signature expressed as a summation of sinusoidal components with varying amplitudes and frequencies. The predetermined harmonic signature may be derived from measurements taken from a plasma process tool operating in an optimal state, and the harmonic signature data may also be received from a manufacturing enterprise system (MES) to enable process-specific waveform generation.

In an embodiment of the present disclosure, the RF power delivery method includes the steps of amplifying the harmonically distorted sinusoidal waveform to produce an amplified waveform suitable for plasma generation, with the amplification step being capable of operating under conditions of high reflected power. In some embodiments, the amplification further includes controlling the gain of the amplifier based on the amplitude of the fundamental frequency component of the harmonically distorted sinusoidal waveform. This ensures precise power delivery under varying load conditions.

In an embodiment of the present disclosure, the RF power delivery method includes the steps of interfacing the amplified waveform with a non-linear plasma load impedance by coupling it through a fixed impedance matching. The impedance-matching is configured to minimize variability in delivered RF power by pre-selecting fixed impedance values and is further optimized for specific plasma process conditions, such as pulsed RF power delivery. Such a step eliminates the need for real-time tuning and ensures stable power delivery across various operational scenarios.

In an embodiment of the present disclosure, the RF power delivery method includes the steps of measuring the RF power spectrum at the output of the fixed impedance-matching network. The measured spectrum is used to adjust the amplified waveform to maintain alignment with the desired harmonic signature and recreate the desired plasma state. In some embodiments, the RF power delivery method also includes the steps of monitoring voltage and current characteristics of the plasma load to detect process anomalies or identify process endpoints. These monitored characteristics may also be used in advanced process control applications, such as real-time feedback for adjusting the harmonic content of the waveform and ensuring optimal plasma state recreation.

The features and advantages of the subject matter hereof will become more apparent in light of the following detailed description of selected embodiments, as illustrated in the accompanying FIGUREs. As one of ordinary skill in the art will realize, the subject matter disclosed herein is capable of modifications in various respects, all without departing from the scope of the subject matter. Accordingly, the drawings and the description are to be regarded as illustrative.

BRIEF DESCRIPTION OF THE DRAWINGS

The present subject matter will now be described in detail with reference to the drawings, which are provided as illustrative examples of the subject matter to enable those skilled in the art to practice the subject matter. It will be noted that throughout the appended drawings, features are identified by reference numerals. Notably, the FIGUREs and examples are not meant to limit the scope of the present subject matter to a single embodiment, but other embodiments are possible by way of interchange of some or all of the described or illustrated elements and, further, wherein.

DETAILED DESCRIPTION OF THE PREFERRED EMBODIMENT

Figure 1:
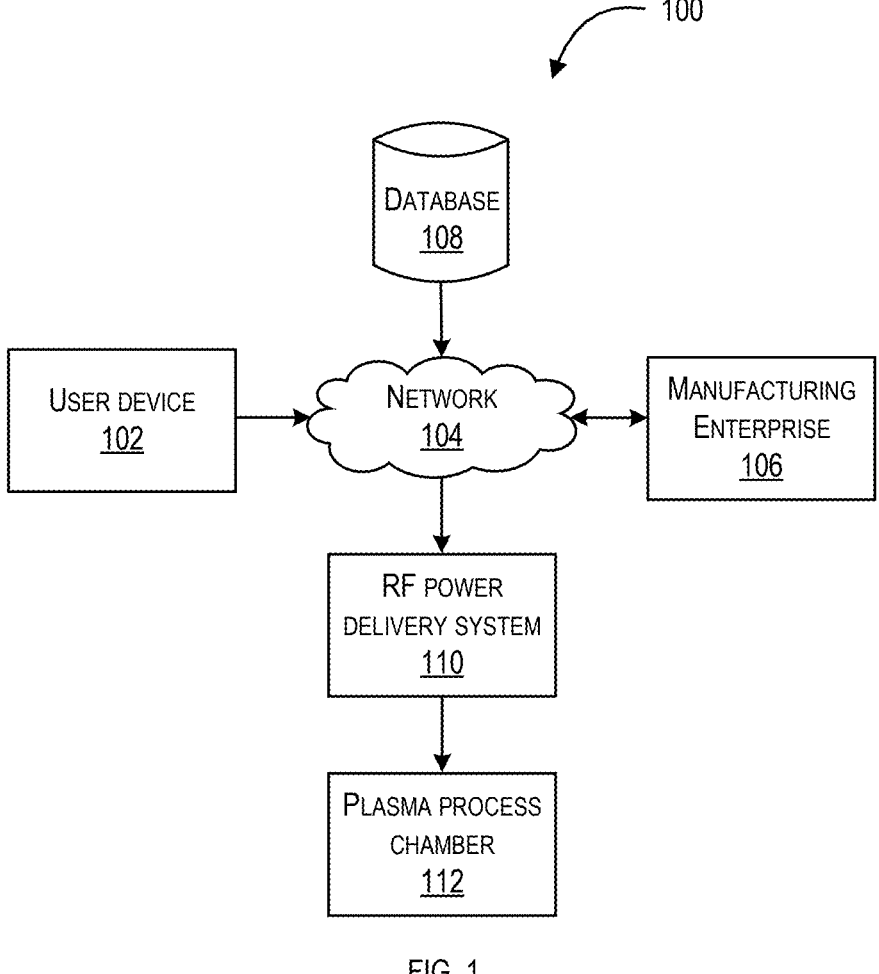
FIG. 1 is an environment having an RF power delivery system for delivering the RF power to a plasma load in a microelectronic manufacturing environment, in accordance with an embodiment of the present disclosure.

The detailed description set forth below in connection with the appended drawings is intended as a description of exemplary embodiments in which the presently disclosed disclosure can be practiced. The term "exemplary" used throughout this description means "serving as an example, instance, or illustration," and should not necessarily be construed as preferred or advantageous over other embodiments. The detailed description includes specific details for providing a thorough understanding of the presently disclosed disclosure. However, it will be apparent to those skilled in the art that the presently disclosed disclosure may be practiced without these specific details. In some instances, well-known structures and devices are shown in block diagram form in order to avoid obscuring the concepts of the presently disclosed disclosure.

The terms "connected" or "coupled" and related terms are used in an operational sense and are not necessarily limited to a direct connection or coupling. Thus, for example, two devices may be coupled directly, or via one or more intermediary media or devices. As another example, devices may be coupled in such a way that information can be passed there between, while not sharing any physical connection. Based on the disclosure provided herein, one of ordinary skill in the art will appreciate a variety of ways in which connection or coupling exists in accordance with the definition.

Further, the term "module" may be software or hardware particularly programmed to receive an input, perform one or more processes using the input, and provide an output. The input, output, and processes performed by various modules will be apparent to one skilled in the art based on the present disclosure.

If the specification states a component or feature "may," "can," "could," or "might" be included or have a characteristic, that particular component or feature is not required to be included or have the characteristic.

As used in the description herein and throughout the claims that follow, the meaning of "a," "an," and "the" includes plural reference unless the context dictates otherwise. Also, as used in the description herein, the meaning of "in" includes "in" and "on" unless the context dictates otherwise.

The phrases "in an embodiment," "according to one embodiment," and the like generally mean the particular feature, structure, or characteristic following the phrase is included in at least one embodiment of the present disclosure and may be included in more than one embodiment of the present disclosure. Importantly, such phrases do not necessarily refer to the same embodiment.

It will be appreciated by those of ordinary skill in the art that the diagrams, schematics, illustrations, and the like represent conceptual views or processes illustrating systems and methods embodying this disclosure. The functions of the various elements shown in the figures may be provided through the use of dedicated hardware as well as hardware capable of executing associated software. Similarly, any switches shown in the figures are conceptual only. Their function may be carried out through the operation of program logic, through dedicated logic, through the interaction of program control and dedicated logic, or even manually, the particular technique being selectable by the entity implementing this disclosure. Those of ordinary skill in the art further understand that the exemplary hardware, software, processes, methods, and/or operating systems described herein are for illustrative purposes and, thus, are not intended to be limited to any particular name.

The present disclosure relates to a Radio Frequency (RF) power delivery system and method (hereafter together termed as 'mechanism') for delivering the RF power using harmonic waveform synthesis to address the limitations of conventional RF power delivery systems in microelectronic manufacturing environments. By generating harmonically distorted sinusoidal waveforms derived from pre-determined harmonic signatures corresponding to desired plasma states, the disclosure enables precise recreation of plasma conditions, significantly reducing process variability and improving reproducibility.

In an embodiment of the present disclosure, the mechanism includes a mathematical waveform generator that produces harmonically distorted sinusoidal waveforms based on a harmonic signature determined from optimal plasma conditions. These waveforms are amplified using a broadband linear power amplifier designed to handle high reflected power, ensuring robustness and stability in dynamic plasma environments. The amplified waveforms are coupled to the plasma load via a fixed impedance matching network, which minimizes variability in delivered RF power by eliminating the need for real-time tuning.

Further, the mechanism incorporates a broadband power spectrum sensor to measure the RF power spectrum at the output of the impedance-matching network. Such a sensor provides real-time feedback to adjust the amplified waveform, ensuring alignment with the desired harmonic signature and thereby maintaining the intended plasma state. Additionally, the mechanism includes a broadband voltage and current sensor to enable advanced process control applications, such as endpoint detection and chamber health monitoring. In an embodiment, the mechanism is also adaptable to modern manufacturing requirements, integrating seamlessly with a manufacturing enterprise system (MES) to receive and utilize harmonic signature data tailored to specific process recipes. Additionally, it supports pulsed RF power delivery and component optimization, offering versatility across a range of plasma-based manufacturing applications.

FIG. 1 is an environment 100 having an RF power delivery system 110 for delivering the RF power to a plasma load in a microelectronic manufacturing environment, in accordance with an embodiment of the present disclosure. In an embodiment, the environment 100 may provide a high-level overview of how the RF power delivery system 110 interacts with various entities, including a user device 102, a network 104, a manufacturing enterprise 106, a database 108, and a process chamber 112, to deliver precise RF power for plasma generation in microelectronic manufacturing environments.

In an embodiment of the present disclosure, the user device 102 may be used by a user, such as an operator or engineer, to interact with the RF power delivery system 110. The user device 102 may be a terminal, workstation, or any computing device that allows the users to input process parameters, such as harmonic signature data, or to monitor system performance. In an embodiment, the network 104 may connect the user device 104, the RF power delivery system 100, and other components of the environment 100, such as the manufacturing enterprise system (MES) 106 and the database 108. Further, the network 104 may facilitate communication and data exchange, enabling seamless operation and ensuring that process-specific information, such as harmonic signatures or endpoint data, is transmitted reliably to the RF power delivery system 110. In an embodiment, the MES 106 may correspond to a centralized platform that manages process recipes, historical data, and operational parameters for various manufacturing processes. Specifically, the MES 106 may provide harmonic signature data corresponding to desired plasma states and the data may be critical for configuring the RF power delivery system 110 to achieve precise plasma conditions. The MES 106 may also monitor system performance and ensure synchronization across multiple manufacturing tools.

In an embodiment, the database 108 may store critical data, including process recipes, harmonic signatures, and operational logs. Also, the database 108 may be used to store historical data, allowing the system to analyze and optimize performance over time while ensuring consistency and reproducibility by providing reference data for plasma state recreation. In an embodiment, the plasma process chamber 112 may be configured to receive the RF power from the RF power delivery system 110. The plasma chamber 112 may contain the plasma load, which is inherently non-linear and exhibits dynamic impedance characteristics. Thus, the RF power delivery system 110 may drive this plasma load to achieve specific chemical reactions, such as etching or deposition, necessary for microelectronic manufacturing.

In operation, the user may initiate a process by selecting or inputting parameters, such as the desired plasma state, on the user device 102. Such inputs may be transmitted through the network 104 to the MES 106 that may retrieve the appropriate process and harmonic signature data from the database 108. Such data may be communicated to the RF power delivery system 110 that may generate a harmonically distorted sinusoidal waveform tailored to the desired plasma state. Then, the RF power delivery system 110 may amplify the waveform and interface with the plasma process chamber 112, delivering RF power to the plasma load. The plasma process chamber 112 may respond by generating the plasma necessary for manufacturing operations. In an embodiment, the RF power delivery system 110 may monitor parameters such as RF power spectrum and harmonic content, ensuring real-time alignment with the desired plasma state and feedback from the RF power delivery system 110 may be transmitted back through the network 104 to the MES 106 and the user device 102 for monitoring and control.

Figure 2:
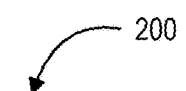
FIG. 2 is a block diagram of the RF power delivery system for delivering the RF power to a plasma load in a microelectronic manufacturing environment, in accordance with an embodiment of the present disclosure.
Figure 2:
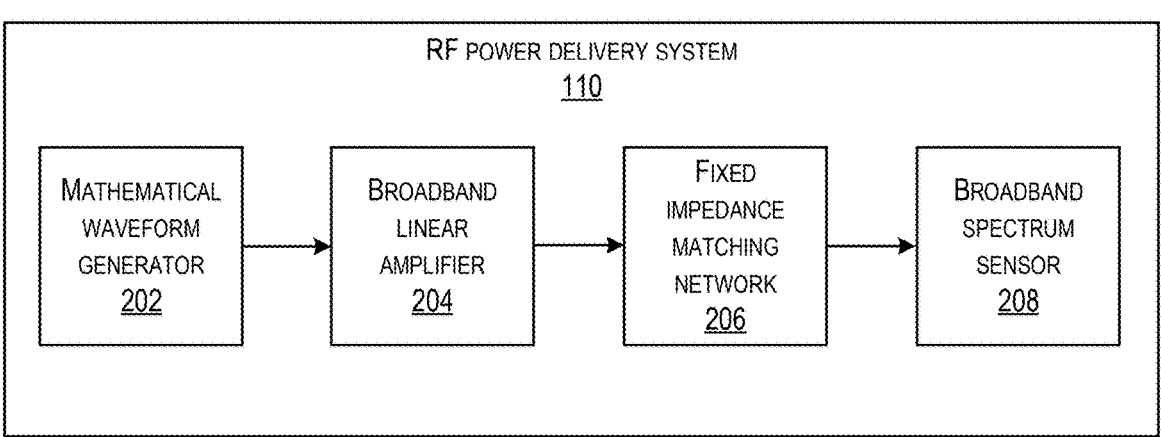

FIG. 2 is a block diagram 200 of the RF power delivery system 110 for delivering the RF power to a plasma load in a microelectronic manufacturing environment, in accordance with an embodiment of the present disclosure. In an embodiment of the present disclosure, the RF power delivery system 110 may include a mathematical waveform generator 202, a broadband linear amplifier 204, a fixed impedance matching network 206, and a broadband spectrum sensor 208.

In an embodiment of the present disclosure, the mathematical waveform generator 202 may generate harmonically distorted sinusoidal waveforms. Such harmonically distorted sinusoidal waveforms may be derived from predetermined harmonic signatures that correspond to desired plasma states. These harmonic signatures may represent specific spectral characteristics of an optimal plasma condition obtained through prior measurements of a reference process tool operating under known "golden" conditions. In an embodiment, the mathematical waveform generator 202 may generate the harmonically distorted sinusoidal waveform using a mathematical representation of the harmonic signature expressed as a summation of sinusoidal components of varying amplitudes and frequencies. For instance, such a representation may take the form of:

$$A*sin(x)+B*sin(2*x)+C*sin(3*x)+D*sin(4*x)+E*sin(5*x);$$

where x=(2*π*f) and f represents the fundamental frequency.

In an embodiment of the present disclosure, the mathematical waveform generator 202 may also be configured to accept harmonic signature data from an external source, such as the MES 106, to enable dynamic adaptation of the waveform to match process-specific requirements. In an embodiment, the mathematical waveform generator 202 may utilize harmonic signature data stored in the database 108 or communicated in real-time from the MES 106 to ensure accurate recreation of desired plasma states for different process recipes. This flexibility allows the generator to support a wide range of applications, including plasma etching, deposition, and chamber cleaning. Additionally, the mathematical waveform generator 202 may include functionalities for dynamically modifying harmonic signatures in response to real-time feedback from downstream components, such as a broadband power spectrum sensor or voltage and current sensors. For instance, if deviations from the desired plasma state are detected, the mathematical waveform generator 202 may adjust the amplitude or phase of specific harmonic components to restore optimal plasma conditions. Such adaptability makes the generator resilient to environmental changes and process variability. The mathematical waveform generator 202 may also support waveform truncation or pulse modulation techniques for specific plasma processes. By incorporating these techniques, the mathematical waveform generator 202 may adapt to high-speed manufacturing environments requiring precise control over the timing and energy delivery of RF power. Furthermore, the mathematical waveform generator 202 may interface with advanced algorithms to optimize the spectral composition of the harmonics, minimizing power losses and improving overall efficiency.

In another embodiment, the mathematical waveform generator 202 may be utilized for broader applications beyond direct plasma state recreation. For example, it may generate waveforms for driving ancillary systems, such as components, to mitigate polymerization or remove residue buildup in vacuum pumps and forelines. In yet another embodiment, the mathematical waveform generator 202 may include learning capabilities, such as integrating machine learning algorithms to analyze historical process data and predict optimal harmonic signatures for future operations.

In an embodiment of the present disclosure, the broadband linear power amplifier 204 may amplify the harmonically distorted sinusoidal waveforms. The broadband linear power amplifier 204 may be designed to handle a broad spectrum of frequencies, including the fundamental frequency and its harmonic components, ensuring efficient and accurate power delivery for plasma state recreation. Additionally, the broadband linear power amplifier 204 may be capable of operating under conditions of high reflected power, making it robust against impedance mismatches that commonly arise due to the non-linear nature of plasma loads. Further, the broadband linear power amplifier 204 may include a feedback control mechanism to adjust gain based on the amplitude of the fundamental frequency component of the harmonically distorted sinusoidal waveform. Such feedback may ensure stable amplification even in dynamically changing plasma environments. For instance, the feedback control may dynamically adapt to fluctuations in load impedance or variations in power requirements, maintaining precise power levels necessary for desired plasma states.

In an embodiment of the present disclosure, the broadband linear power amplifier 204 may include features to support pulsed RF power delivery to be used in advanced plasma processes, such as atomic layer etching (ALE) or plasma-enhanced atomic layer deposition (PE-ALD), where precise control over power delivery timing is critical. The broadband linear power amplifier 204 may generate high-fidelity waveforms with sharp rise and fall times while maintaining consistent harmonic content, enabling it to meet the stringent requirements of such processes. Further, the broadband linear power amplifier 204 may also incorporate mechanisms to enhance thermal management and operational stability. For example, the broadband linear power amplifier 204 may include active cooling systems or materials with high thermal conductivity to dissipate heat generated during high-power operations that may prevent performance degradation and ensure long-term reliability in demanding manufacturing environments. In another embodiment, the broadband linear power amplifier 204 may be designed to minimize power losses by employing high-efficiency circuit topologies, such as Class AB or Class D configurations. These designs ensure that the broadband linear power amplifier 204 may deliver maximum power to the plasma load while reducing energy dissipation in the form of heat.

In an embodiment of the present disclosure, the broadband linear power amplifier 204 may further support advanced monitoring and diagnostics. For example, the broadband linear power amplifier 204 may include integrated sensors to measure voltage, current, and power levels at various stages of amplification. Such measurements may be used to identify potential issues, such as component wear or signal distortion before they impact performance. In yet another embodiment of the present disclosure, the broadband linear power amplifier 204 may be integrated with machine learning algorithms for predictive maintenance and performance optimization. By analyzing historical data and real-time feedback, the broadband linear power amplifier 204 may predict potential failure points or recommend operational adjustments to maximize efficiency and reliability. Beyond its role in plasma generation, the broadband linear power amplifier 204 may also be used for auxiliary applications, such as powering components or driving cleaning processes. For instance, the broadband linear power amplifier 204 may deliver harmonically tuned power to remove polymerization or other residues in vacuum pumps, extending the lifetime of these components and reducing maintenance costs.

In an embodiment of the present disclosure, the fixed impedance matching network 206 may interface with a non-linear plasma load impedance. Unlike conventional auto-tuning impedance matching networks, which rely on mechanical or electronic adjustments to achieve impedance matching, the fixed impedance matching network 206 may be pre-configured based on the harmonic signature and fundamental frequency of the RF waveform and this may eliminate the need for real-time tuning and minimizes variability in delivered RF power, ensuring consistency and reproducibility in plasma processes. In an embodiment, the fixed impedance matching network 206 may be optimized for specific plasma process conditions, including pulsed RF power delivery that may be utilized in advanced microelectronic manufacturing processes, where rapid and precise power delivery is critical. Further, the fixed impedance matching network 206 may be designed to handle the dynamic impedance variations associated with such pulsed operations without compromising power delivery efficiency or stability.

In an embodiment of the present disclosure, the fixed impedance matching network 206 may minimize power losses typically associated with conventional tuning systems by eliminating components prone to wear, such as mechanically adjustable capacitors or inductors. Such design improves the overall reliability and operational lifetime of the RF power delivery system 110, reducing maintenance requirements and enhancing system uptime in demanding manufacturing environments. In another embodiment of the present disclosure, the RF power delivery system 110 may include a broadband voltage and current sensor positioned downstream of the fixed impedance matching network 206. Further, the broadband voltage and current sensor may monitor key parameters of the plasma load, including voltage, current, and power characteristics, to provide real-time insights into plasma behavior. Such monitoring enables advanced process control applications, such as endpoint detection, where precise identification of the completion of an etching or deposition step is critical. Furthermore, the broadband voltage and current sensor may also be used for anomaly detection during plasma processing. By continuously analyzing the plasma load's electrical characteristics, the voltage and current sensor can identify deviations from expected behavior, allowing operators or automated systems to take corrective action before process quality is compromised.

In an embodiment of the present disclosure, the fixed impedance matching network 206 may support advanced feedback mechanisms enabled by sensors. For example, data from the broadband voltage and current sensor may be fed back to the mathematical waveform generator 202 or the broadband linear power amplifier 204 to dynamically adjust the RF power delivery. Such feedback ensures that the harmonic content and amplitude of the waveform are consistently aligned with the desired plasma state, compensating for environmental or process-induced variability. Further, the fixed impedance matching network 206 may also be configurable to accommodate specific chamber and process requirements. For instance, the fixed impedance matching network 206 may be tailored to match the impedance of chambers with unique gas chemistries, pressures, or temperature profiles, ensuring optimal power transfer and reducing variability across tools. In yet another embodiment, the fixed impedance matching network 206 may also extend the operational life of components by ensuring stable and harmonically tuned power delivery to minimize variability and energy losses that may lead to residue buildup or inefficiencies in downstream systems, such as vacuum pumps or abatement systems.

In an embodiment of the present disclosure, the broadband power spectrum sensor 208 may measure the RF power spectrum at the output of the fixed impedance matching network 206. By analyzing the spectral composition of the delivered RF power, the broadband power spectrum sensor 208 ensures that the harmonic content aligns precisely with the predetermined harmonic signature corresponding to a desired plasma state. This measurement enables real-time adjustments to the amplified harmonically distorted sinusoidal waveform, maintaining the intended plasma state and reducing process variability. The broadband power spectrum sensor 208 may also provide real-time feedback to upstream components, such as the mathematical waveform generator 202 and broadband linear power amplifier 204. This feedback loop ensures that any deviations in harmonic content, amplitude, or phase are corrected dynamically, compensating for environmental changes, process variability, or load-induced fluctuations. Such real-time feedback enables the RF power delivery system 110 to maintain a high degree of precision and reproducibility in plasma-based processes.

In an embodiment of the present disclosure, the broadband power spectrum sensor 208 may support advanced calibration and optimization of the RF power delivery system 110. For example, the sensor may be used during setup to derive harmonic signatures from a plasma process tool operating in a known optimal state. Such signatures may be stored as reference data for future operations, ensuring that the RF power delivery system 110 can consistently recreate optimal plasma conditions across tools and processes. In another embodiment of the present disclosure, the broadband power spectrum sensor 208 may be used to detect transient anomalies in the RF power spectrum, such as sudden shifts in harmonic amplitudes or the appearance of unexpected spectral components. Such anomalies may indicate issues with the plasma load, impedance matching network, or upstream components, enabling preemptive corrective actions to maintain process stability. Additionally, the broadband power spectrum sensor 208 may be integrated with predictive analytics algorithms to forecast potential deviations in the RF power spectrum. By analyzing historical data and identifying patterns, the broadband power spectrum sensor 208 may predict when deviations are likely to occur and proactively adjust waveform generation or amplification to mitigate their impact.

In an embodiment of the present disclosure, the broadband power spectrum sensor 208 may operate in conjunction with other sensors, such as a broadband voltage and current sensor, to provide comprehensive monitoring of the plasma load. By combining spectral data with electrical characteristics, the RF power delivery system 110 may gain deeper insights into plasma behavior, enabling applications such as endpoint detection, anomaly detection, and chamber health monitoring. This integration ensures that the RF power delivery system 110 not only meets the desired plasma state but also maintains optimal performance throughout the process. Further, the broadband power spectrum sensor 208 may also be adaptable to diverse plasma process conditions, including those requiring pulsed RF power delivery. In such scenarios, the broadband power spectrum sensor 208 may monitor the spectral composition of both the fundamental and harmonic components during pulse cycles, ensuring that the waveform maintains its fidelity under dynamic conditions. Such adaptability makes the sensor indispensable for advanced manufacturing applications, such as atomic layer etching (ALE) and plasma-enhanced atomic layer deposition (PE-ALD).

In an additional embodiment, the broadband power spectrum sensor 208 may be utilized for auxiliary applications, such as optimizing the RF power delivery system 110 for cleaning the components or monitoring abatement systems. By analyzing the spectral characteristics of power delivered to these systems, the broadband power spectrum sensor 208 may ensure their efficient operation and prolong their service life. In yet another embodiment, the broadband power spectrum sensor 208 may interface with the MES 106 to provide real-time spectral data for centralized monitoring and process optimization. Further, the MES 106 may use this data to adjust process recipes or harmonics for future runs, ensuring tool-to-tool consistency and process reproducibility across a manufacturing facility.

Figure 3A:
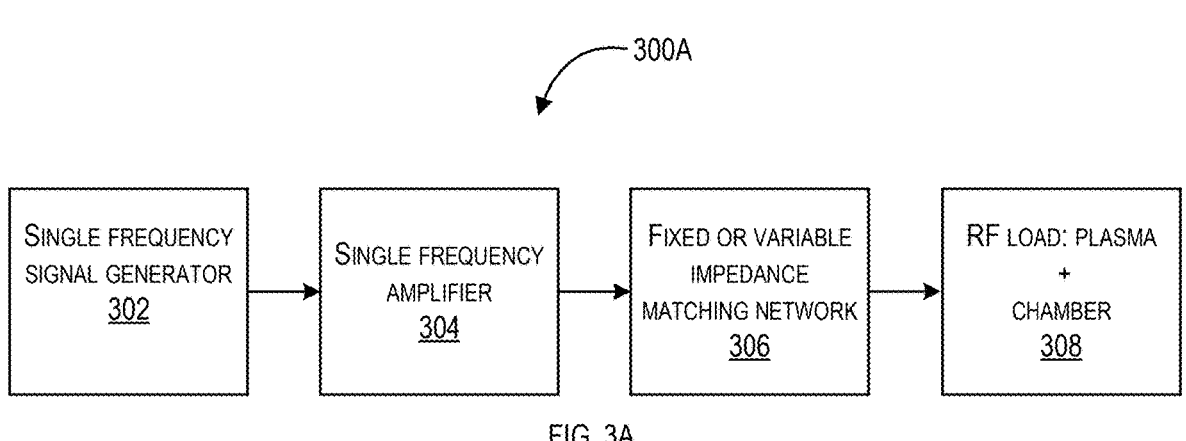
FIG. 3A is a block diagram of the RF power delivery system with a single-frequency signal generator and a single-frequency amplifier, in accordance with an embodiment of the present disclosure.
Figure 3B:
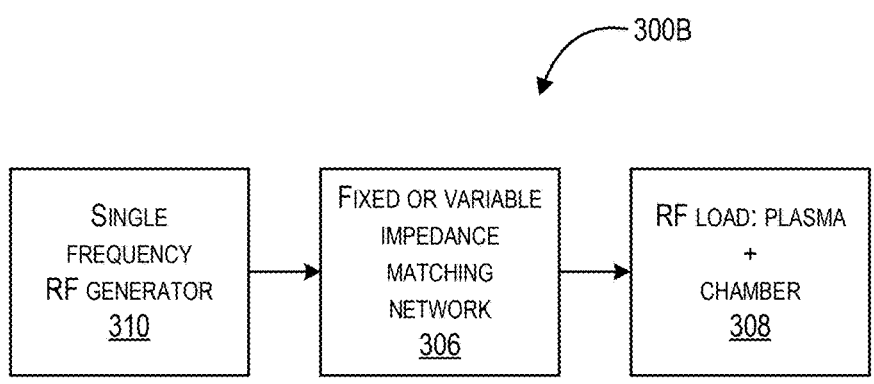
FIG. 3B is a block diagram of the RF power delivery system with the single frequency signal generator and without the single frequency amplifier, in accordance with an embodiment of the present disclosure.

FIG. 3A is a block diagram 300A of the RF power delivery system 110 with a single-frequency signal generator and a single-frequency amplifier, in accordance with an embodiment of the present disclosure. FIG. 3B is a block diagram 300B of the RF power delivery system 110 with the single frequency signal generator and without the single frequency amplifier, in accordance with an embodiment of the present disclosure. For the sake of brevity, the FIGS. 3A and 3B have been explained together.

In one embodiment, as illustrated in FIG. 3A, the RF power delivery system 110 utilized in microelectronic manufacturing environments to supply radio frequency (RF) power to plasma loads is illustrated that consists of a single frequency signal generator 302 that may produce a fixed-frequency sinusoidal waveform as its output. Such RF signal may be amplified by a single frequency amplifier 304 to meet the required power levels necessary for plasma generation. The amplified signal may then be passed through a fixed or variable impedance matching network 306 which may compensate for impedance mismatches between the RF source and the plasma load. In order to compensate for the impedance mismatching, the fixed or variable impedance matching network 306 may utilize passive components such as capacitors and inductors to ensure maximum power transfer and minimize reflected power. In an embodiment, the RF load may include the plasma and the process chamber, as shown by 308. Further, the plasma load 308 may be inherently non-linear, causing harmonic distortions in the RF signal. It may be apparent to a person skilled in the art that such distortions, along with variability from other subsystems, may contribute to process inconsistency, thereby limiting the reproducibility and yield of manufacturing processes in conventional solutions.

In another embodiment, as shown in FIG. 3B, in a more integrated version of the RF power delivery system 110, the single-frequency signal generator 302 and the single-frequency amplifier 306 may combined into a single subassembly, forming an integrated single-frequency RF generator 310 to simplify system architecture. In such an assembly, the RF power delivery system 110 may include the fixed or variable impedance matching network 306 positioned between the integrated RF generator 310 and the plasma load 308. The impedance-matching network may optimize power transfer by transforming the non-linear plasma load impedance into a value that matches the output impedance of the RF generator. However, in the system in FIG. 3A, the fixed or variable impedance matching network 306 may be subject to variability from mechanical wear and environmental factors. Thus, the conventional solutions may rely on single-frequency RF power delivery and impedance matching, which are insufficient to fully mitigate process variability. Also, the systems of FIGS. 3A and 3B have challenges posed by plasma-induced harmonic distortions along with the dependency on traditional impedance matching techniques. Accordingly, to overcome such issues, improved RF power delivery systems capable of addressing such variability in a robust and reliable manner are explained in detail in FIGS. 4A and 4B.

Figure 4A:
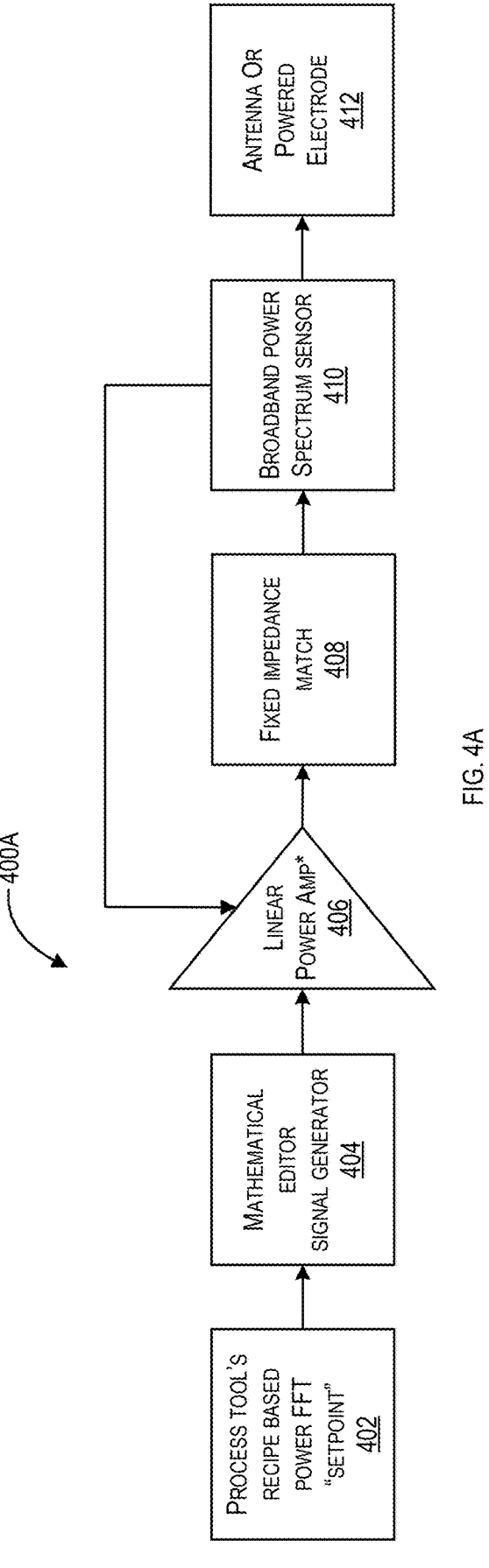
FIG. 4A is a block diagram of an improved RF power delivery system, in accordance with an embodiment of the present disclosure.
Figure 4B:
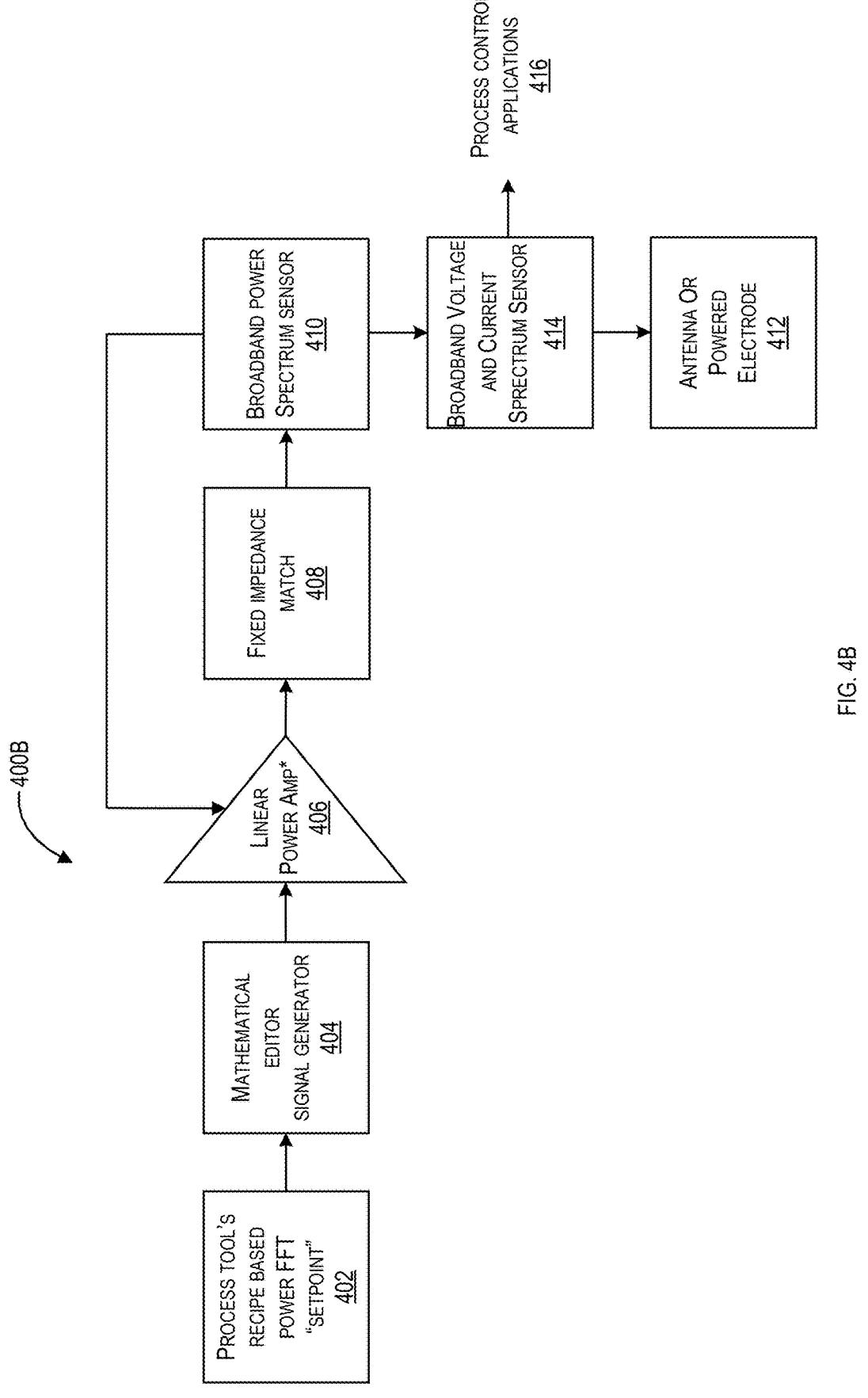
FIG. 4B is a block diagram of an enhanced version of the RF power delivery system, in accordance with an embodiment of the present disclosure.

FIG. 4A is a block diagram 400A of an improved RF power delivery system 110, in accordance with an embodiment of the present disclosure. FIG. 4B is a block diagram 400B of an enhanced version of the RF power delivery system 110, in accordance with an embodiment of the present disclosure. For the sake of brevity, the FIGS. 4A and 4B have been explained together.

In an embodiment, as illustrated in FIG. 4A, the RF power delivery system 110 may use harmonically distorted sinusoidal waveforms to recreate a precise plasma state, significantly enhancing process consistency and reducing variability. The operation of the RF power delivery system 110 may begin with a process tool's recipe-based power FFT "setpoint" 402 that represents the process-specific configuration for achieving a desired plasma state. Such setpoint may provide harmonic signature data derived from prior measurements of optimal plasma conditions, guiding the generation of waveforms tailored to specific manufacturing processes. Further, a mathematical editor signal generator 404 may use the harmonic signature data from the setpoint to produce a harmonically distorted sinusoidal waveform as a summation of sinusoidal components of varying amplitudes and frequencies, ensuring alignment with the desired plasma state. In an embodiment, the mathematical editor signal generator 404 may support dynamic adaptability by responding to feedback from the broadband power spectrum sensor 410, enabling real-time adjustments to harmonic amplitudes or phases to maintain plasma state precision.

In an embodiment of the present disclosure, the harmonically distorted sinusoidal waveform generated by the signal generator 404 may be amplified by the broadband linear power amplifier 406 that may ensure that the waveform is amplified to suitable power levels while preserving the integrity of the harmonic content. Further, the broadband linear power amplifier 406 may be robustly designed to tolerate high reflected power conditions that arise from interfacing with non-linear plasma loads and incorporate feedback control mechanisms to dynamically adjust gain based on the fundamental frequency component. Furthermore, the broadband linear power amplifier 406 may also be optimized for advanced processes, such as pulsed RF power delivery, ensuring high efficiency and precision under dynamic plasma conditions.

In an embodiment, the amplified waveform may then be passed through the fixed impedance matching network 408 that interfaces the amplified signal with the plasma load. Such fixed impedance matching network 408 may be pre-configured to match the amplifier's output impedance to the plasma load's non-linear impedance, ensuring efficient power transfer without the need for real-time tuning. It may be apparent to a person skilled in the art that such fixed configuration reduces variability and enhances reliability, particularly in high-speed manufacturing environments requiring pulsed RF power delivery. In an embodiment, the broadband power spectrum sensor 410 may monitor the RF power spectrum at the output of the impedance matching network 408 to analyze the harmonic content of the delivered waveform and provide real-time feedback to upstream components, such as the signal generator and amplifier, ensuring alignment with the desired plasma state. Further, the amplified and harmonically tuned RF power may be delivered to the antenna or powered electrode 412, which may be interfaced directly with the plasma load within the process chamber. In an embodiment of the present disclosure, the antenna or powered electrode 412 may apply the RF power to the plasma load, enabling precise plasma generation necessary for microelectronic manufacturing processes, such as etching, deposition, or chamber cleaning. Accordingly, the RF power delivery system 110 may achieve precision, consistency, and reproducibility in plasma-based microelectronic manufacturing processes.

In an embodiment, as illustrated in FIG. 4B, the RF power delivery system 110 may incorporate advanced monitoring and process control features. Further, the operation of the RF power delivery system 110 may begin with the recipe-based power FFT "setpoint" 402 that may provide the harmonic signature necessary for achieving a desired plasma state which may be derived from measurements of optimal plasma conditions and defines the fundamental frequency and harmonic components required for specific manufacturing processes. Further, the mathematical editor signal generator 404 may use the harmonic signature to produce a harmonically distorted sinusoidal waveform tailored to the desired plasma state. The waveform may be generated as a summation of sinusoidal components with varying amplitudes and frequencies, and the generator 404 may support real-time adaptability by interacting with feedback from other components to maintain alignment with the process requirements. Furthermore, the waveform generated by the signal generator 404 may be amplified by the broadband linear power amplifier 406 to suitable power levels while preserving the fidelity of the harmonic content. The broadband linear power amplifier 406 may be robustly designed to tolerate high reflected power conditions caused by the non-linear impedance of plasma loads and may incorporate feedback mechanisms to dynamically adjust gain based on the fundamental frequency, ensuring precise and consistent power delivery.

In an embodiment of the present disclosure, the amplified waveform is then passed through the fixed impedance matching network 408, which interfaces the amplifier's output with the plasma load. Further, the fixed impedance network 408 may be pre-configured to match the non-linear impedance of the plasma load, eliminating the need for real-time tuning and reducing variability. Such a fixed configuration may ensure stable power transfer and may be optimized for advanced processes, including pulsed RF power delivery. Furthermore, to monitor and refine the system's performance, the broadband power spectrum sensor 410 may analyze the RF power spectrum at the output of the fixed impedance matching network 408 and may provide real-time feedback to the signal generator and amplifier, enabling dynamic adjustments to maintain the desired plasma state. Additionally, the broadband voltage and current spectrum sensor 414 may be positioned downstream of the fixed impedance matching network 408 to monitor electrical parameters such as voltage and current characteristics of the plasma load. Such sensors may support advanced process control applications, including endpoint detection and chamber health monitoring, by identifying deviations from expected plasma behavior or detecting the completion of process steps.

In an embodiment of the present disclosure, the harmonically tuned RF power may be delivered to the plasma load through the antenna or powered electrode 412 which may serve as the interface between the RF power delivery system 110 and the plasma load within the process chamber 112, applying the optimized RF power to generate the plasma required for manufacturing processes. In an embodiment, the RF power delivery system 110 may also integrate with process control applications 416 that leverage data from the spectrum sensors to enable real-time process adjustments, anomaly detection, and predictive maintenance.

Figure 5:
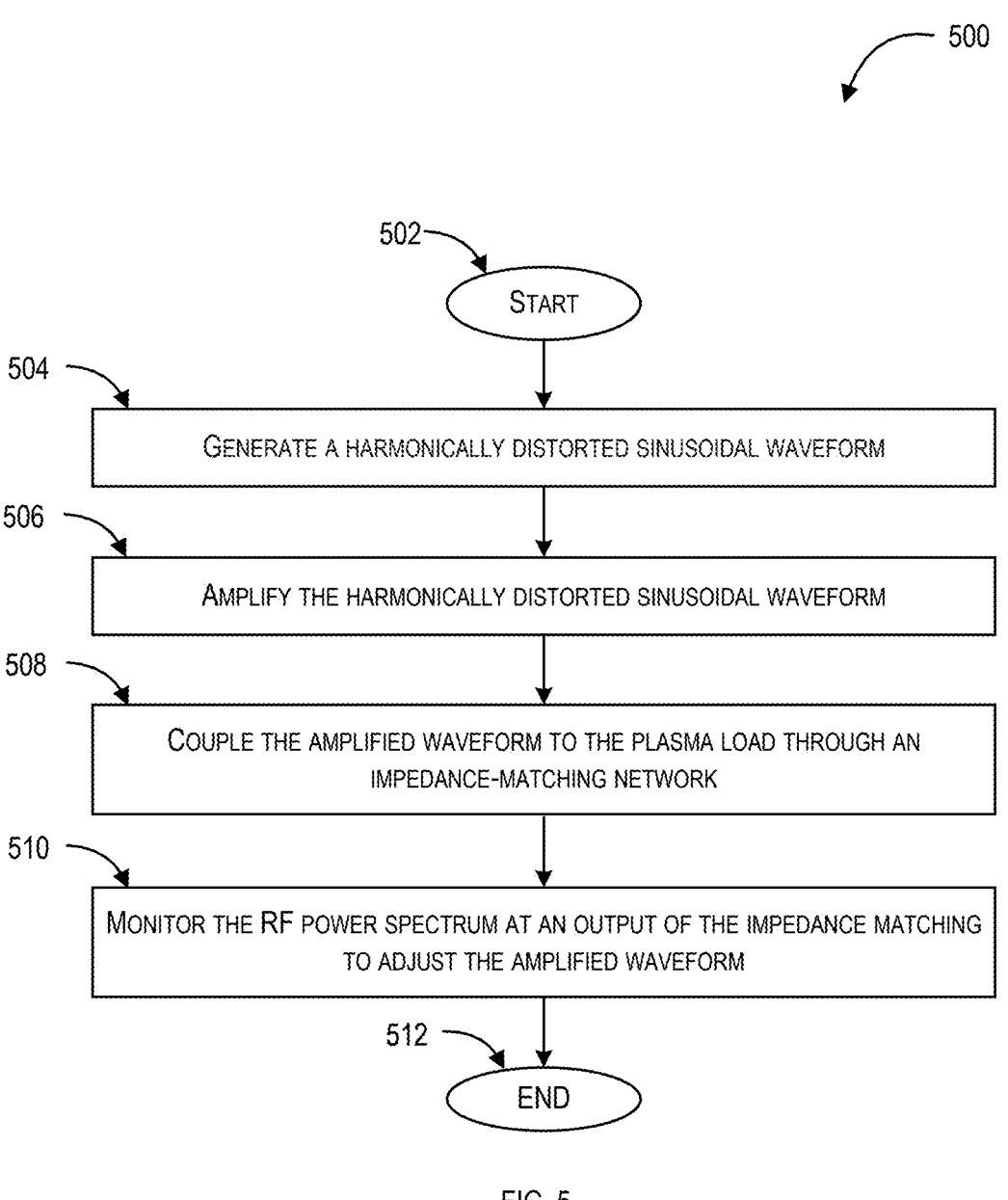
FIG. 5 is a flowchart of a RF power delivery method for delivering the RF power to a plasma load in a microelectronic manufacturing environment, in accordance with an embodiment of the present disclosure.

FIG. 5 is a flowchart 500 of a RF power delivery method for delivering the RF power to a plasma load in a microelectronic manufacturing environment, in accordance with an embodiment of the present disclosure. The RF power delivery method may start at step 502.

At first, a harmonically distorted sinusoidal waveform that is derived from a predetermined harmonic signature corresponding to a desired plasma state is generated, at step 504. In some embodiments, the generation of the harmonically distorted sinusoidal waveform may further include using a mathematical representation of the harmonic signature expressed as a summation of sinusoidal components with varying amplitudes and frequencies. Further, the predetermined harmonic signature may be derived from measurements taken from a plasma process tool operating in an optimal state, and the harmonic signature data may also be received from a manufacturing enterprise system (MES) to enable process-specific waveform generation.

Next, at step 506, the harmonically distorted sinusoidal waveform may be amplified to produce an amplified waveform suitable for plasma generation. Such an amplification step may be capable of operating under conditions of high reflected power. In some embodiments, the amplification may further include controlling the gain of the amplifier based on the amplitude of the fundamental frequency component of the harmonically distorted sinusoidal waveform. This ensures precise power delivery under varying load conditions.

Next, at step 508, the amplified waveform may be coupled to the plasma load through an impedance-matching network by interfacing the amplified waveform with a non-linear plasma load impedance. The impedance-matching may be configured to minimize variability in delivered RF power by pre-selecting fixed impedance values and is further optimized for specific plasma process conditions, such as pulsed RF power delivery. Accordingly, the RF power delivery method may eliminate the need for real-time tuning and ensure stable power delivery across various operational scenarios.

Thereafter, at step 510, the RF power spectrum at the output of the fixed impedance-matching network may be monitored and measured to adjust the amplified waveform. The measured spectrum may be used to adjust the amplified waveform to maintain alignment with the desired harmonic signature and recreate the desired plasma state. In some embodiments, the RF power delivery method may also include the steps of monitoring voltage and current characteristics of the plasma load to detect process anomalies or identify process endpoints. These monitored characteristics may also be used in advanced process control applications, such as real-time feedback for adjusting the harmonic content of the waveform and ensuring optimal plasma state recreation. The method may stop at step 512.

Figure 6:
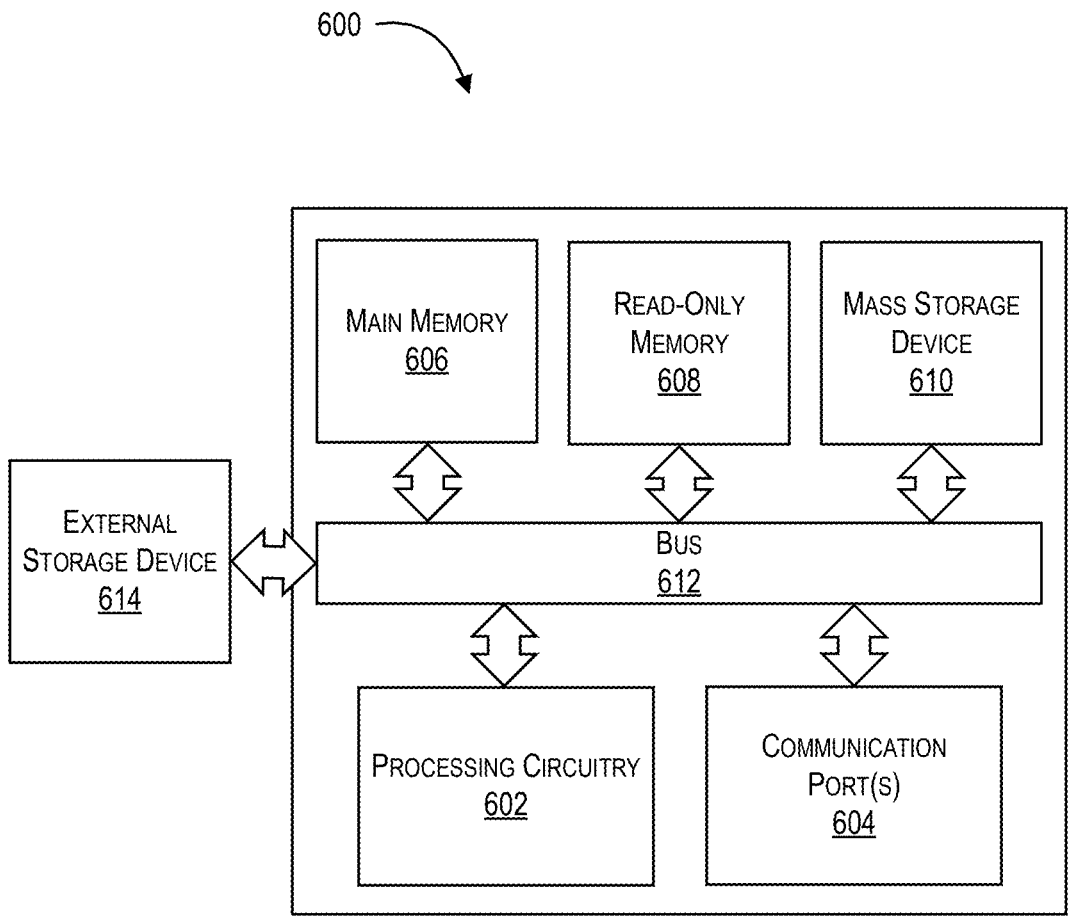
FIG. 6 illustrates an exemplary computer unit in which or with which embodiments of the present disclosure may be utilized.

FIG. 6 illustrates an exemplary computer system 600 in which or with which embodiments of the present disclosure may be utilized. Depending upon the implementation, the various processes and decision blocks described above may be performed by hardware components, embodied in machine-executable instructions, which may be used to cause a general-purpose or special-purpose processor programmed with the instructions to perform the steps, or the steps may be performed by a combination of hardware, software and/or firmware. As shown in FIG. 6, the computer system 600 includes an external storage device 614, a bus 612, a main memory 606, a read-only memory 608, a mass storage device 610, a communication port(s) 604, and a processing circuitry 602.

Those skilled in the art will appreciate that the computer system 600 may include more than one processing circuitry 602 and one or more communication ports 604. The processing circuitry 602 should be understood to mean circuitry based on one or more microprocessors, microcontrollers, digital signal processors, programmable logic devices, Field-Programmable Gate Arrays (FPGAs), Application-Specific Integrated Circuits (ASICs), etc., and may include a multi-core processor (e.g., dual-core, quad-core, Hexa-core, or any suitable number of cores) or supercomputer. In some embodiments, the processing circuitry 602 is distributed across multiple separate processors or processing units, for example, multiple of the same type of processing units (e.g., two Intel Core i7 processors) or multiple different processors (e.g., an Intel Core i5 processor and an Intel Core i7 processor). Examples of the processing circuitry 602 include, but are not limited to, an Intel® Itanium® or Itanium 2 processor(s), AMD® Opteron® or Athlon MP® processor(s), Motorola® lines of processors, System on Chip (SoC) processors, or other future processors. The processing circuitry 602 may include various modules associated with embodiments of the present disclosure.

The communication port 604 may include a cable modem, Integrated Services Digital Network (ISDN) modem, a Digital Subscriber Line (DSL) modem, a telephone modem, an Ethernet card, or a wireless modem for communications with other equipment, or any other suitable communications circuitry. Such communications may involve the Internet or any other suitable communications networks or paths. In addition, communications circuitry may include circuitry that enables peer-to-peer communication of electronic devices or communication of electronic devices in locations remote from each other. The communication port 604 may be any RS-232 port for use with a modem-based dialup connection, a 10/100 Ethernet port, a Gigabit, or a 10 Gigabit port using copper or fiber, a serial port, a parallel port, or other existing or future ports. The communication port 604 may be chosen depending on a network, such as a Local Area Network (LAN), Wide Area Network (WAN), or any network to which the computer system 600 may be connected.

The main memory 606 may include Random Access Memory (RAM) or any other dynamic storage device commonly known in the art. Read-only memory (ROM) 608 may be any static storage device(s), e.g., but not limited to, a Programmable Read-Only Memory (PROM) chips for storing static information, e.g., start-up or BIOS instructions for the processing circuitry 602.

The mass storage device 610 may be an electronic storage device. As referred to herein, the phrase "electronic storage device" or "storage device" should be understood to mean any device for storing electronic data, computer software, or firmware, such as random-access memory, read-only memory, hard drives, optical drives, Digital Video Disc (DVD) recorders, Compact Disc (CD) recorders, BLU-RAY disc (BD) recorders, BLU-RAY 3D disc recorders, Digital Video Recorders (DVRs, sometimes called a personal video recorder or PVRs), solid-state devices, quantum storage devices, gaming consoles, gaming media, or any other suitable fixed or removable storage devices, and/or any combination of the same. Nonvolatile memory may also be used (e.g., to launch a boot-up routine and other instructions). Cloud-based storage may be used to supplement the main memory 606. The mass storage device 610 may be any current or future mass storage solution, which may be used to store information and/or instructions. Exemplary mass storage solutions include, but are not limited to, Parallel Advanced Technology Attachment (PATA) or Serial Advanced Technology Attachment (SATA) hard disk drives or solid-state drives (internal or external, e.g., having Universal Serial Bus (USB) and/or Firmware interfaces), e.g., those available from Seagate (e.g., the Seagate Barracuda 7200 family) or Hitachi (e.g., the Hitachi Deskstar 7K1000), one or more optical discs, Redundant Array of Independent Disks (RAID) storage, e.g., an array of disks (e.g., SATA arrays), available from various vendors including Dot Hill Systems Corp., LaCie, Nexsan Technologies, Inc. and Enhance Technology, Inc.

The bus 612 communicatively couples the processing circuitry 602 with the other memory, storage, and communication blocks. The bus 612 may be, e.g., a Peripheral Component Interconnect (PCI)/PCI Extended (PCI-X) bus, Small Computer System Interface (SCSI), USB, or the like, for connecting expansion cards, drives, and other subsystems as well as other buses, such a front side bus (FSB), which connects processing circuitry 602 to the software system.

Optionally, operator and administrative interfaces, e.g., a display, keyboard, and a cursor control device, may also be coupled to the bus 612 to support direct operator interaction with the computer system 600. Other operator and administrative interfaces may be provided through network connections connected through the communication port(s) 604. The external storage device 614 may be any kind of external hard drive, floppy drive, IOMEGA® Zip Drive, Compact Disc-Read-Only Memory (CD-ROM), Compact Disc-Re-Writable (CD-RW), Digital Video Disk-Read Only Memory (DVD-ROM). The components described above are meant only to exemplify various possibilities. In no way should the aforementioned exemplary computer system limit the scope of the present disclosure.

The computer system 600 may be accessed through a user interface. The user interface application may be implemented using any suitable architecture. For example, it may be a stand-alone application wholly implemented on the computer system 600. The user interfaces application and/or any instructions for performing any of the embodiments discussed herein may be encoded on computer-readable media. Computer-readable media includes any media capable of storing data. In some embodiments, the user interface application is client-server-based. Data for use by a thick or thin client implemented on an electronic device computer system 600 is retrieved on-demand by issuing requests to a server remote to the computer system 600. For example, computer system 600 may receive inputs from the user via an input interface and transmit those inputs to the remote server for processing and generating the corresponding outputs. The generated output is then transmitted to the computer system 600 for presentation to the user.

Thus, the present disclosure discloses a system and method for location-based security verification of users. The method and system enhance user privacy and protect personal data from malicious purposes including identity theft and unauthorized access. The system extends beyond individual privacy protection; organizations also gain significant advantages by adopting advanced identity verification measures provided to prevent data breaches and unauthorized access attempts. The location-aware technology protects against identity theft and secures access to companies' critical infrastructure. The method and system confirm the accuracy of the location data, ensuring it has not been spoofed or in any way compromised. This additional layer of protection is used in conjunction with environmental base security measures to create a comprehensive security solution. The technology creates virtual boundaries around physical locations, using geofencing, that enables organizations to monitor employee movements and track facility perimeters effectively. This helps prevent unauthorized access as well as reduces the risk of insider threats. The use of reflectometry increases navigation accuracy and enables the evaluation of surfaces for the identification of certain substances.

The location-aware technology offers a solution to combat identity theft by enabling the tracking of individuals' devices. The use of custom advanced algorithms, the technology can monitor the movement patterns of devices associated with users' unique identities. Unusual or inconsistent travel patterns are identified as red flags that indicate potential identity theft. This application of machine learning communicates notifications to impacted individuals when their devices move to locations that do not align with their usual travel patterns. Timely alerts play a crucial role in enabling individuals to take necessary actions to protect their identities. The method and system to operate independently of satellites as a navigational tool should they be compromised or in areas where the signal strength required is not achievable to minimize impact to users and companies. The technology operates securely when transmitting data and extends the current capabilities of existing mesh networks. Finally, the system is not susceptible to hacking, spoofing, jamming, solar flares, and orbital chain reactions.

While embodiments of the present disclosure have been illustrated and described, it will be clear that the disclosure is not limited to these embodiments only. Numerous modifications, changes, variations, substitutions, and equivalents will be apparent to those skilled in the art without departing from the spirit and scope of the disclosure, as described in the claims.

Thus, it will be appreciated by those of ordinary skill in the art that the diagrams, schematics, illustrations, and the like represent conceptual views or processes illustrating systems and methods embodying this disclosure. The functions of the various elements shown in the figures may be provided through the use of dedicated hardware as well as hardware capable of executing associated software. Similarly, any switches shown in the figures are conceptual only. Their function may be carried out through the operation of program logic, through dedicated logic, through the interaction of program control and dedicated logic, or even manually, the particular technique being selectable by the entity implementing this disclosure. Those of ordinary skill in the art further understand that the exemplary hardware, software, processes, methods, and/or operating systems described herein are for illustrative purposes and, thus, are not intended to be limited to any particular name.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously. Within the context of this document, the terms "coupled to" and "coupled with" are also used euphemistically to mean "communicatively coupled with" over a network, where two or more devices are able to exchange data with each other over the network, possibly via one or more intermediary device.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, utilized, or combined with other elements, components, or steps that are not expressly referenced. Where the specification claims refer to at least one of something selected from the group consisting of A, B, C . . . . And N, the text should be interpreted as requiring only one element from the group, not A plus N, or B plus N, etc.

While the foregoing describes various embodiments of the disclosure, other and further embodiments of the disclosure may be devised without departing from the basic scope thereof. The scope of the disclosure is determined by the claims that follow. The disclosure is not limited to the described embodiments, versions, or examples, which are included to enable a person having ordinary skill in the art to make and use the disclosure when combined with information and knowledge available to the person having ordinary skill in the art.

The foregoing description of embodiments is provided to enable any person skilled in the art to make and use the subject matter. Various modifications to these embodiments will be readily apparent to those skilled in the art, and the novel principles and subject matter disclosed herein may be applied to other embodiments without the use of the innovative faculty. The claimed subject matter set forth in the claims is not intended to be limited to the embodiments shown herein but is to be accorded to the widest scope consistent with the principles and novel features disclosed herein. It is contemplated that additional embodiments are within the spirit and true scope of the disclosed subject matter.

What is claimed is:

1. A radio frequency (RF) power delivery system for delivering the RF power to a plasma load in a microelectronic manufacturing environment, the RF power delivery system comprising:
    a mathematical waveform generator to generate a harmonically distorted sinusoidal waveform, the harmonically distorted sinusoidal waveform being derived from a predetermined harmonic signature corresponding to a desired plasma state;
    a broadband linear power amplifier to amplify the harmonically distorted sinusoidal waveform and capable of operating under conditions of high reflected power;
    a fixed impedance matching network to interface with a non-linear plasma load impedance; and
    a broadband power spectrum sensor to measure the RF power spectrum at an output of the fixed impedance matching network, the measured spectrum being used to adjust the amplified harmonically distorted sinusoidal waveform to recreate a desired plasma state.

2. The RF power delivery system of claim 1, wherein the mathematical waveform generator generates the harmonically distorted sinusoidal waveform using a mathematical representation of the harmonic signature expressed as a summation of sinusoidal components of varying amplitudes and frequencies.

3. The RF power delivery system of claim 1, wherein the broadband linear power amplifier includes a feedback control mechanism to adjust gain based on the amplitude of the fundamental frequency component of the harmonically distorted sinusoidal waveform.

4. The RF power delivery system of claim 1, further comprising a broadband voltage and current sensor positioned downstream of the fixed impedance matching network, wherein the broadband voltage and current sensor monitors parameters of plasma load for process control applications.

5. The RF power delivery system of claim 4, wherein the broadband voltage and current sensor is used for endpoint detection during plasma processing.

6. The RF power delivery system of claim 1, wherein the fixed impedance matching network minimizes variability in delivered RF power by eliminating need for real-time tuning.

7. The RF power delivery system of claim 1, wherein the fixed impedance matching network is optimized for specific plasma process conditions, including pulsed RF power delivery.

8. The RF power delivery system of claim 1, wherein the broadband power spectrum sensor also provides real-time feedback for adjusting the harmonic content of the waveform to match a reference plasma state.

9. The RF power delivery system of claim 1, wherein the harmonic signature is derived from measurements taken from a plasma process tool operating in a known optimal state.

10. The RF power delivery system of claim 1, further comprising a manufacturing enterprise system (MES) configured to communicate process-specific harmonic signature data to the mathematical waveform generator.

11. A radio frequency (RF) power delivery method for delivering the RF power to a plasma load in a microelectronic manufacturing environment, the RF power delivery method comprising:
    generating a harmonically distorted sinusoidal waveform, the harmonically distorted sinusoidal waveform being derived from a predetermined harmonic signature corresponding to a desired plasma state;
    amplifying the harmonically distorted sinusoidal waveform and capable of operating under conditions of high reflected power;
    interfacing with a non-linear plasma load impedance; and
    measuring the RF power spectrum at an output of the fixed impedance matching network, the measured spectrum being used to adjust the amplified harmonically distorted sinusoidal waveform to recreate a desired plasma state.

12. The RF power delivery method of claim 11, further comprises generating the harmonically distorted sinusoidal waveform using a mathematical representation of the harmonic signature expressed as a summation of sinusoidal components of varying amplitudes and frequencies.

13. The RF power delivery method of claim 11, further comprises controlling the gain of the amplification step based on the amplitude of the fundamental frequency component of the harmonically distorted sinusoidal waveform.

14. The RF power delivery method of claim 11, further comprising monitoring voltage and current characteristics of the plasma load to detect endpoints or anomalies in the plasma process.

15. The RF power delivery method of claim 14, further comprising using monitored voltage and current characteristics for detecting process endpoints during plasma processing.

16. The RF power delivery method of claim 11, further comprising configuring the impedance-matching step to minimize variability in delivered RF power by pre-selecting fixed impedance values.

17. The RF power delivery method of claim 11, further comprising configuring the impedance-matching step to accommodate pulsed RF power delivery for plasma processes.

18. The RF power delivery method of claim 11, further comprising providing real-time feedback from the monitored RF power spectrum to adjust the harmonic content of the waveform to match a reference plasma state.

19. The RF power delivery method of claim 11, further comprising deriving the predetermined harmonic signature from measurements taken from a plasma process tool operating in an optimal state.

20. The RF power delivery method of claim 11, further comprising receiving harmonic signature data from a manufacturing enterprise system (MES) and using the data to generate the harmonically distorted sinusoidal waveform.

\* \* \* \* \*